US006123555A

United States Patent [19]
Chiu

[11] Patent Number: 6,123,555
[45] Date of Patent: Sep. 26, 2000

[54] STRUCTURE OF THE FEMALE SEAT OF A HIGH FREQUENCY CONNECTOR

[75] Inventor: Te-Chao Chiu, Taipei Hsien, Taiwan

[73] Assignee: Wieson Electronic Co., Ltd., Taipei Hsien, Taiwan

[21] Appl. No.: 09/335,263

[22] Filed: Jun. 17, 1999

[51] Int. Cl.[7] ................................ H05K 1/00; H01R 9/24
[52] U.S. Cl. ................................ 439/79; 439/885
[58] Field of Search ................................ 439/79, 885

[56] References Cited

U.S. PATENT DOCUMENTS 5,266,038 11/1993 Nakamura ................................ 439/79
5,725,386 3/1998 Davis et al. ................................ 439/79

*Primary Examiner*—Michael L. Gellner
*Assistant Examiner*—Mahmoud Anwar A. Mohamed
*Attorney, Agent, or Firm*—Jacobson, Price, Holman & Stern, PLLC

[57] ABSTRACT

An improvement structure of the female seat of a high frequency connector, wherein two sets of symmetric L shape terminals are inserted to the rear side of a female seat of a connector, each L shape terminals are arranged from outer side to inner side and from larger one to smaller one sequentially; characterized in that the L shape terminals are integrally formed on a protrusion which is extended from the lateral side of a long strip material. According to the aforementioned structure, since each set of L shape terminals with different sizes are arranged integrally on the protrusion in installation. Therefore, the L shape terminals with different sizes are not necessary to be manufactured one by one and it is unnecessary to be secondarily finished for bending. Therefore, it has a simple manufacturing process and the manufacturing cost is reduced for increasing the competition of market.

1 Claim, 5 Drawing Sheets

STRUCTURE OF THE FEMALE SEAT OF A HIGH FREQUENCY CONNECTOR

BACKGROUND OF THE INVENTION

1. Field of the Invention

The present invention relates to an improvement structure of the female seat of a high frequency connector, wherein L shape terminals are integrally formed on a protrusion which is extended from the lateral side of a long strip material. Therefore, the L shape terminals are unnecessary to be secondarily finished for bending. Therefore, it has a simple manufacturing process and the manufacturing cost is reduced for increasing the competition of market.

2. Description of the Prior Art

In a general used female seat a of a high frequency connector, two sets of symmetric L shape terminals b are inserted to the rear side of a female seat of a connector, each L shape terminals are arranged from outer side to inner side and from larger one to smaller one sequentially, as shown in FIG. 3. Straight original terminals bl are integrally formed on a protrusion which is extended from the lateral side of a long strip material as shown in FIG. 4. In order to enhance the conductivity of the L shape terminal b, the original terminal bl connected at the strip material is plated by two different high conductivities and then the original terminal is cut. Then, a secondary finishing is performed for cutting the terminal and then bending the terminal to form as a flat L shape, as shown in FIG. 5.

In order to enhance the conductivity of the L shape terminal b and save more material, thus plating materials are two different material with high conductivities. Since the terminal has an L shape, a two stage plating can not be performed easily. Therefore, in the prior art, an initial terminal b1 with flat shape is manufactured initially, then plating is performed, and finally, two secondary bending is performed.

The prior art L shape terminal b must be secondarily finished for being bent to form with a desired shape. Thus, the manufacturing process is complex and costly.

Furthermore, since each L shape terminal is arranged from larger one to smaller one. Thus, they have different shapes. As a result, in plating and secondarily finishing, the terminal must be fabricated one by one. Therefore, the manufacturing process is complex and costly and thus the commercial competition is reduced.

According to the aforementioned structure, since each set of L shape terminals with different sizes are arranged integrally on the protrusion in installation.

SUMMARY OF THE INVENTION

Accordingly, the object of the present invention is to provide an improvement structure of the female seat of a high frequency connector, wherein two sets of symmetric L shape terminals are inserted to the rear side of a female seat of a connector, each L shape terminals are arranged from outer side to inner side and from larger one to smaller one sequentially; characterized in that the L shape terminals are integrally formed on a protrusion which is extended from the lateral side of a long strip material. According to the aforementioned structure, since each set of L shape terminals with different sizes are arranged integrally on the protrusion in installation. Therefore, the L shape terminals with different sizes are not necessary to be manufactured one by one and it is unnecessary to be secondarily finished for bending. Therefore, it has a simple manufacturing process and the manufacturing cost is reduced for increasing the competition of market.

The present invention will be better understood and its numerous objects and advantages will become apparent to those skilled in the art by referencing to the following drawings in which:

DETAILED DESCRIPTION OF THE PREFERRED EMBODIMENT

Figure 1:
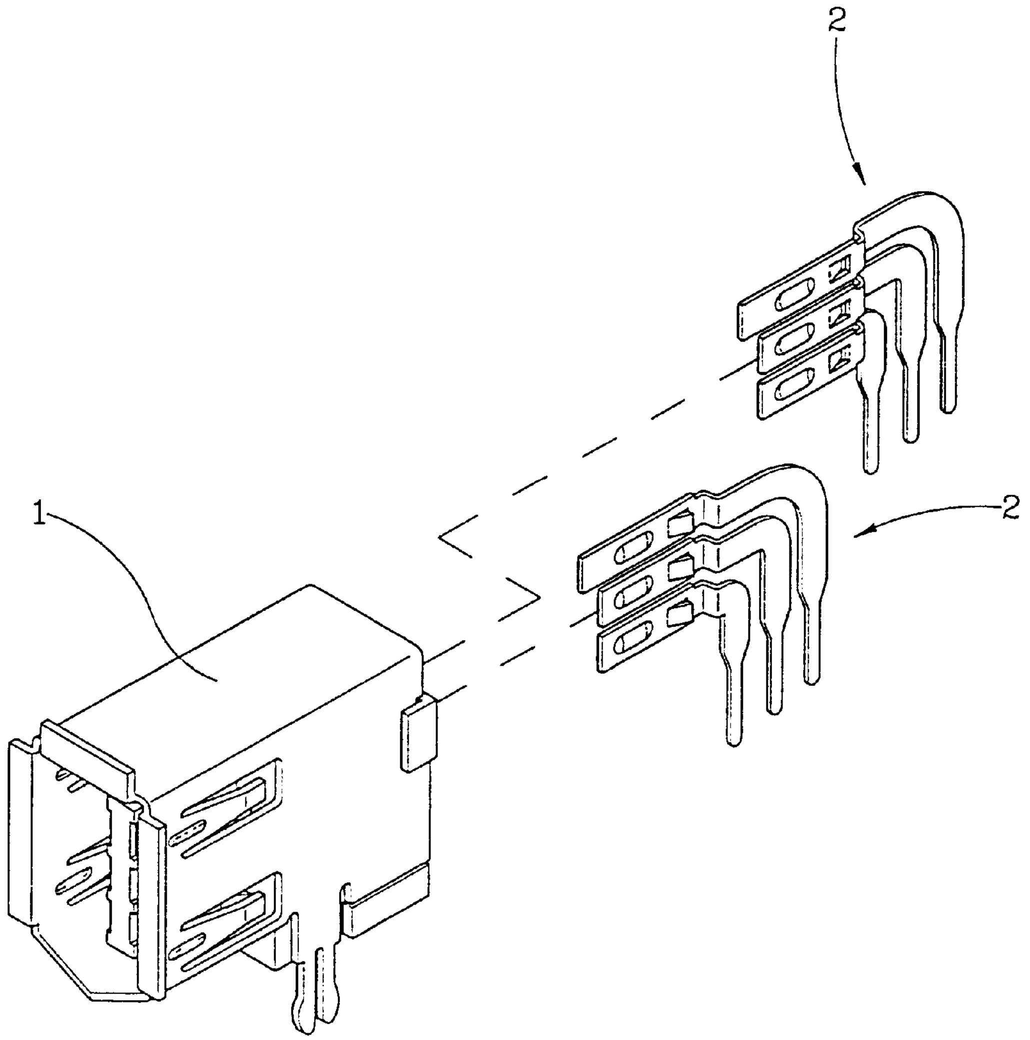
FIG. 1 is an assembled exploded view of the present invention.
Figure 2:
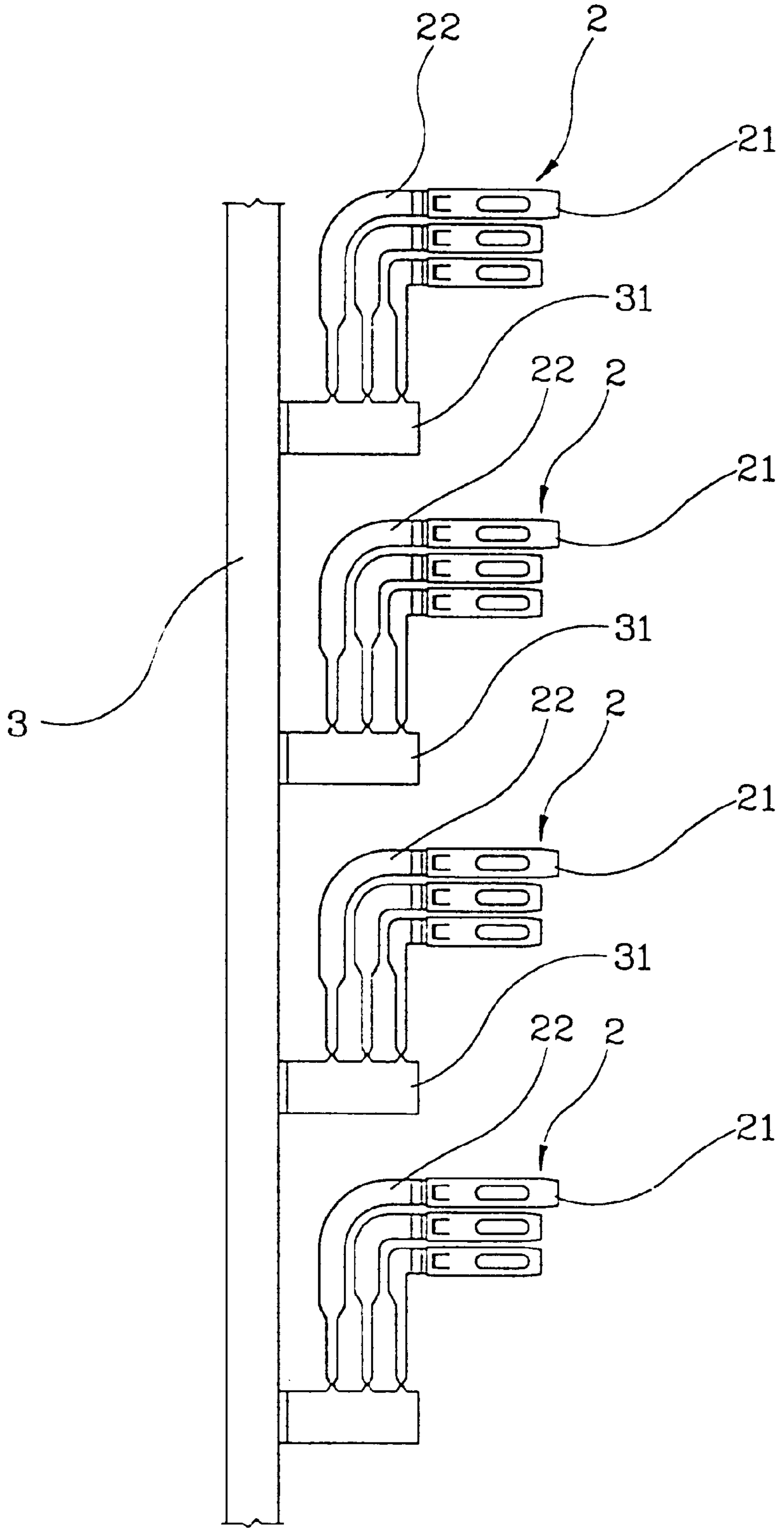
FIG. 2 is an upper view of the present invention.
Figure 3:
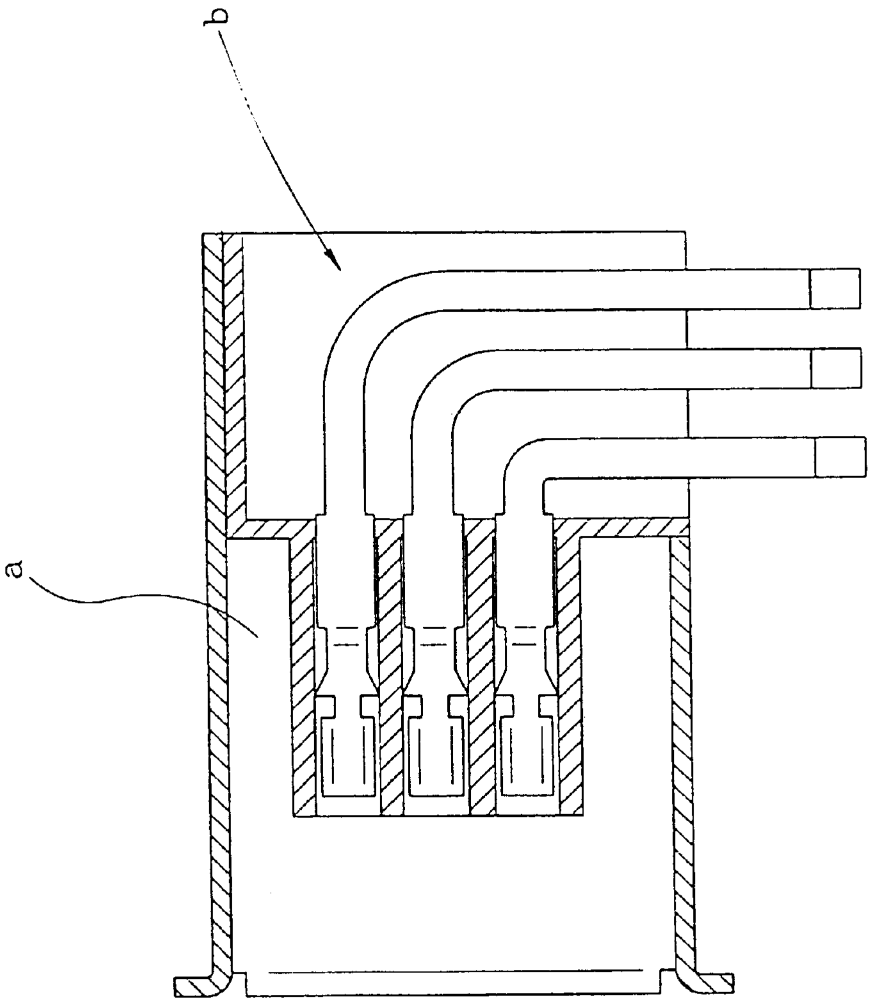
FIG. 3 is an assembled schematic view of the present invention.
Figure 4:
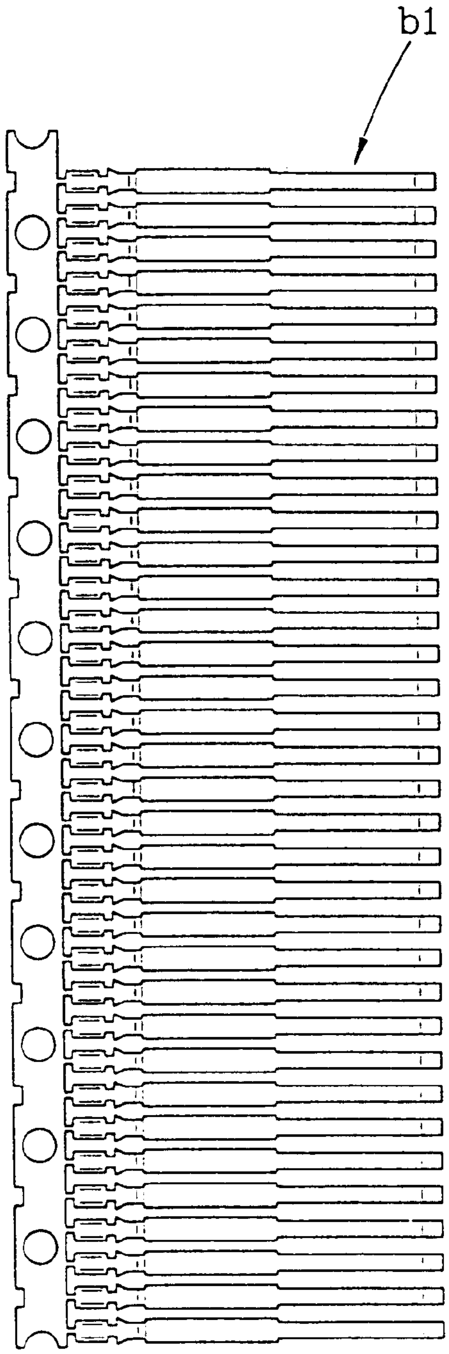
FIG. 4 is a schematic view showing a prior art L shape terminal not being secondarily finished.
Figure 5:
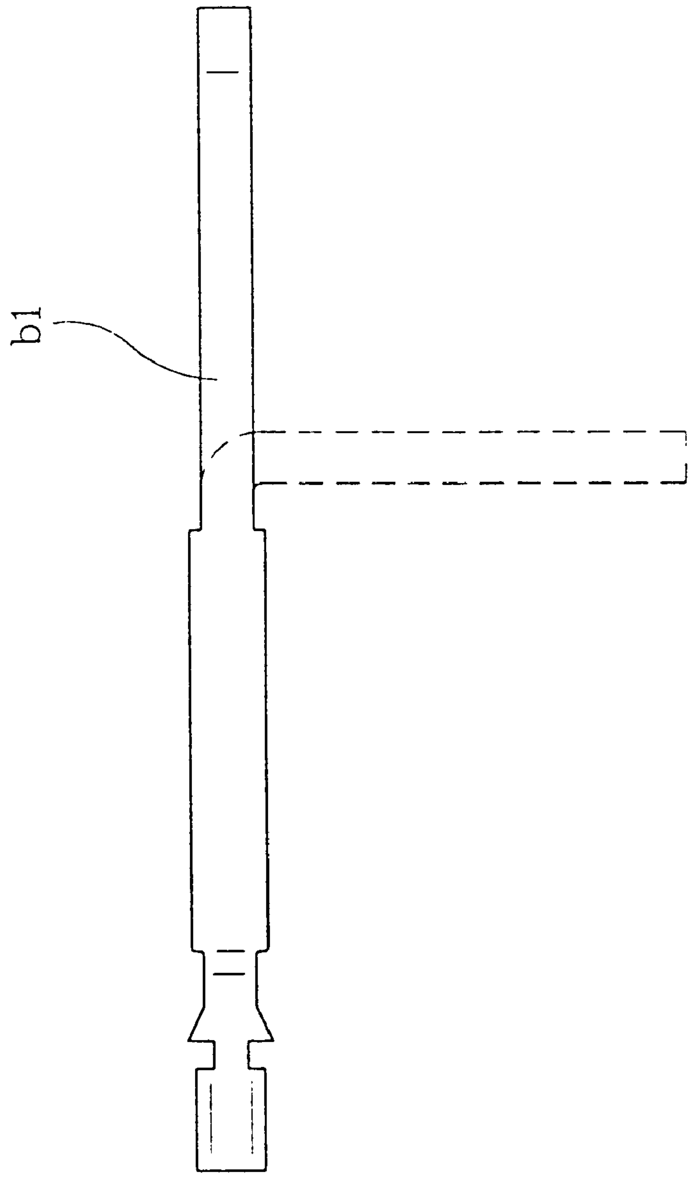
FIG. 5 is a schematic view showing a prior art L shape terminal being secondarily finished.

At first, with reference to FIG. 1, in the present invention, two sets of symmetric L shape terminals are inserted to the rear side of a female seat 1 of a connector. Each L shape terminals are arranged from outer side to inner side and from larger one to smaller one sequentially.

As especially thereabove, the L shape terminals 2 are integrally formed on a protrusion 31 which is extended from the lateral side of a long strip material 3.

According to the aforementioned structure, since each set of L shape terminals 2 with different sizes are arranged integrally on the protrusion 31 in installation. Therefore, the L shape terminals with different sizes are not necessary to be manufactured one by one and it is unnecessary to be secondarily finished for bending. Therefore, it has a simple manufacturing process and the manufacturing cost is reduced for increasing the commercial competition.

Moreover, since each set of the L shape terminals 2 with different sizes are formed integrally, thus, the positions for plating materials of different high conductivities are apparent. Thus the process for plating different material may be performed.

Although the present invention has been described using specified embodiment, the examples are meant to be illustrative and not restrictive. It is clear that many other variations would be possible without departing from the basic approach, demonstrated in the present invention.

What is claimed is:

1. An improvement of the structure of a female seat of a high frequency connector, wherein two sets of symmetric L shape terminals are inserted to the rear side of a female seat of a connector, each of the L shape terminals are arranged from outer side to inner side and from larger one to smaller ones sequentially; comprising:

The L shape terminals are integrally formed on a protrusion which is extended from the lateral side of a long strip material.

* * * * *